United States Patent [19]
Spahn et al.

[11] Patent Number: 5,726,462
[45] Date of Patent: Mar. 10, 1998

[54] SEMICONDUCTOR STRUCTURES HAVING ELECTRICALLY INSULATING AND CONDUCTING PORTIONS FORMED FROM AN ALSB-ALLOY LAYER

[75] Inventors: Olga B. Spahn; Kevin L. Lear, both of Albuquerque, N. Mex.

[73] Assignee: Sandia Corporation, Albuquerque, N. Mex.

[21] Appl. No.: 597,730

[22] Filed: Feb. 7, 1996

[51] Int. Cl.[6] .................................... H01L 31/0256
[52] U.S. Cl. .................... 257/76; 257/22; 257/77; 257/82; 257/192
[58] Field of Search ........................ 257/22, 76, 77, 257/88, 192

[56] References Cited

U.S. PATENT DOCUMENTS

| | | | |
|---|---|---|---|
| 4,492,743 | 1/1985 | Howe | 429/111 |
| 4,521,800 | 6/1985 | Howe | 357/67 |
| 4,534,099 | 8/1985 | Howe | 29/572 |
| 5,262,360 | 11/1993 | Holonyak | 437/237 |

OTHER PUBLICATIONS

Shibata et al Japn. J. Appl. Phys 33 1767 (1994).

C. W. Wilmsen, "Oxide Layers on III–V Compound Semiconductors," *Thin Solid Films*, vol. 39, pp. 105–117, 1976.

Roger L. Farrow, Richard K. Chang, S. Mroczkowski, and Fred Pollack, "Detection of Excess Crystalline As and Sb in III–V Oxide Interfaces by Raman Scattering," *Applied Physics Letters*, vol. 31, pp. 768–770, 1 Dec. 1977.

F. Charfi, M. Zouaght, A. Joullie, M. Balkanski, and C. Hirlimann, "Light Scattering on Residual Sb Layers Formed After Surface Oxidization of $Ga_{1-x}Al_xSb$," *Physica Status Solidi (b)*, vol. 98, pp. 709–714, 1980.

G. P. Schwartz, G. J. Gualtieri, J. E. Griffiths, C. D. Thurmond, and B. Schwartz, "Oxide–Substrate and Oxide–Oxide Chemical Reactions in Thermally Annealed Anodic Films on GaSb, GaAs, and GaP," *Journal of the Electrochemical Society: Solid–State Science and Technology*, vol. 127, pp. 2488–2499, Nov. 1980.

J. M. Guglielmacci, F. Charfi, and A. Joullie, "Analyse De L'Interface Oxyde–Semiconductor De AlSb par Spectrometrie Auger et Diffusion Raman," *Thin Solid Films*, vol. 76, pp. 69–75, 1981.

(List continued on next page.)

*Primary Examiner*—Sara W. Crane
*Assistant Examiner*—Douglas Wille
*Attorney, Agent, or Firm*—John P. Hohimer

[57] ABSTRACT

A semiconductor structure. The semiconductor structure comprises a plurality of semiconductor layers formed on a substrate including at least one layer of a III–V compound semiconductor alloy comprising aluminum (Al) and antimony (Sb), with at least a part of the AlSb-alloy layer being chemically converted by an oxidation process to form superposed electrically insulating and electrically conducting portions. The electrically insulating portion formed from the AlSb-alloy layer comprises an oxide of aluminum (e.g. $Al_2O_3$), while the electrically conducting portion comprises Sb. A lateral oxidation process allows formation of the superposed insulating and conducting portions below monocrystalline semiconductor layers for forming many different types of semiconductor structures having particular utility for optoelectronic devices such as light-emitting diodes, edge-emitting lasers, vertical-cavity surface-emitting lasers, photodetectors and optical modulators (waveguide and surface normal), and for electronic devices such as heterojunction bipolar transistors, field-effect transistors and quantum-effect devices. The invention is expected to be particularly useful for forming light-emitting devices for use in the 1.3–1.6 µm wavelength range, with the AlSb-alloy layer acting to define an active region of the device and to effectively channel an electrical current therein for efficient light generation.

52 Claims, 9 Drawing Sheets

OTHER PUBLICATIONS

J. Bregman and Y. Shapira, "Quantitative Auger Analysis by Depth Profiling of Line Shapes: Application to Native Oxide-InSb Interfaces," *Journal of Vacuum Science and Technology*, vol. B 3, pp. 959–963, Jul./Aug. 1985.

S. Basu, N. Basu, and P. Barman, "Electrical Characterization of Thermally Grown Native Oxide on Gallium Antimonide," *Materials Science and Engineering*, vol. B 9, pp. 47–50, 1991.

F. A. Kish, S. J. Caracci, N. Holonyak, Jr., J. M. Dellesasse, A. R. Sugg, R. M. Fletcher, C. P. Kuo, T. D. Osentowski, and M. G. Craford, "Native-Oxide Stripe-Geometry $In_{0.5}(Al_xGa_{1-x})_{0.5}P-In_{0.5}Ga_{0.5}P$ Heterostructure Laser Diodes," *Applied Physics Letters*, vol. 59, pp. 354–356, 15 Jul. 1991.

F. A. Kish, S. J. Caracci, N. Holonyak, Jr., J. M. Dallesasse, K. C. Hsieh, M. J. Ries, S. C. Smith, and R. D. Burnham, "Planar Native-Oxide Index-Guided $Al_xGa_{1-x}As-GaAs$ Quantum Well Heterostructure Lasers," *Applied Physics Letters*, vol. 59, pp. 1755–1757, 30 Sep. 1991.

F. A. Kish, S. J. Caracci, S. A. Maranowski, N. Holonyak, Jr., S. C. Smith, and R. D. Burnham, "Planar Native-Oxide $Al_xGa_{1-x}As-GaAs$ Quantum Well Heterostructure Ring Laser Diodes," *Applied Physics Letters*, vol. 60, pp. 1582–1584, 30 Mar. 1992.

S. J. Caracci, M. R. Krames, N. Holonyak, Jr., M. J. Ludowise, and A. Fischer-Colbrie, "Long Wavelength ($\lambda \sim 1.5$ µm) Native-Oxide-Defined InAlAs-InP-InGaasP Quantum Well Heterostructure Laser Diodes," *Journal of Applied Physics*, vol. 75, pp. 2706–2708, 1 Mar. 1994.

T. Shibata, J. Nakata, Y. Nanishi, and M. Fujimoto, "A Rutherford Backscattering Spectroscopic Study of the Aluminum Antimonide Oxidation Process in Air," *Japanese Journal of Applied Physics, Part 1*, vol. 33, pp. 1767–1772, Apr. 1994.

D. L. Huffaker, D. G. Deppe, K. Kumar, and T. J. Rogers, "Native-Oxide Defined Ring Contact for Low Threshold Vertical-Cavity Lasers," *Applied Physics Letters*, vol. 65, pp. 97–99, 4 Jul. 1994.

K. L. Lear, K. D. Choquette, R. P. Schneider, Jr., S. P. Kilcoyne, and K. M. Geib, "Selectively Oxidised Vertical Cavity Surface Emitting Lasers with 50% Power Conversion Efficiency," *Electronics Letters*, vol. 31, pp. 208–209, 2 Feb. 1995.

D. I. Babic, K. Streubel, R. P. Mirin, N. M. Margalit, J. E. Bowers, E. L. Hu, D. E. Mars, L. Yang, and K. Carey, "Room-Temperature Continuous-Wave Operation of 1.54–µm Vertical-Cavity Lasers," *IEEE Photonics Technology Letters*, vol. 7, pp. 1225–1227, Nov. 1995.

K. D. Choquette, K. L. Lear, R. P. Schneider, Jr., K. M. Geib, J. J. Figel, and R. Hull, "Fabrication and Performance of Selectively Oxidized Vertical-Cavity Lasers," *IEEE Photonics Technology Letters*, vol. 7, pp. 1237–1239, Nov. 1995.

SEMICONDUCTOR STRUCTURES HAVING ELECTRICALLY INSULATING AND CONDUCTING PORTIONS FORMED FROM AN ALSB-ALLOY LAYER

This invention was made with Government support under Contract No. DE-AC04-94AL85000 awarded by the U.S. Department of Energy. The Government has certain rights in the invention.

FIELD OF THE INVENTION

The present invention relates generally to semiconductor structures and devices having one or more AlSb-alloy layers therein, and in particular to such structures and devices wherein the AlSb-alloy layers are chemically converted, at least in part, to form superposed electrically insulating and electrically conducting portions. Semiconductor devices formed according to the present invention may include optoelectronic devices (e.g. light-emitting diodes, edge-emitting lasers, vertical-cavity surface-emitting lasers, photodetectors and optical modulators) and electronic devices (e.g. heterojunction bipolar transistors, field-effect transistors and quantum-effect devices).

BACKGROUND OF THE INVENTION

The formation of native (or natural) oxides from epitaxially-grown semiconductor layers is becoming of increasing importance for many types of III–V compound semiconductor devices. In the case of optoelectronic devices such as edge-emitting lasers (EELs) and vertical-cavity surface-emitting lasers (VCSELs), oxidation of one or more AlGaAs semiconductor layers has been disclosed for providing optical and current confinement in the lasers (see, for example, F. A. Kish, et al. in Applied Physics Letters, vol. 59, pp. 1755–1757, 30 Sep. 1991; and K. D. Choquette, et al. in IEEE Photonics Technology Letters, vol. 7, pp. 1237–1239, November 1995). Native oxide layer formation directly on fully-exposed surfaces of III–V compound semiconductor substrates (i.e. bulk crystals) has also been studied for possible use in forming passivation layers and electronic devices on the substrates (see, for example, C. W. Wilmsen, in Thin Solid Films, vol. 39, pp. 105–117, 1976; and F. Charfi et at., in Physica Status Solidi (b), vol. 98, pp. 709–714, 1980).

In the case of AlGaAs, the formation of a native oxide layer (also referred to herein as an oxide layer) comprising aluminum oxide is accompanied by the formation of volatile arsenic compounds which diffuse through the oxide layer and are released. For other aluminum-alloy substrates (i.e. bulk crystals) of III–V compound-semiconductors such as $Al_xGa_{1-x}Sb$, the formation of a native oxide layer from an outer surface of the substrate results in an excess of the group V element (e.g. Sb) that accumulates at an interface between the oxide layer and the substrate. Such accumulation is attributed to a low diffusion rate of the group V element which, being unable to escape laterally or upward through the oxide layer, is driven downward to the oxide-substrate interface by formation of the oxide layer. Thus, according to the prior art the oxidation of a fully-exposed surface of an AlSb-alloy substrate results in the formation of an Sb layer below the formed oxide layer and at the interface with the substrate. Furthermore, as far as is known herein, the prior art does not disclose formation of oxide layers from AlSb-alloy layers encapsulated or buried below other aluminum-free layers in a layered semiconductor structure.

An advantage of the present invention is that a layered semiconductor structure may be formed on a substrate with one or more of the layers being an AlSb-alloy layer that is chemically converted, at least in part, to form an electrically conducting portion comprising Sb overlying an electrically insulating portion comprising an oxide of aluminum.

Another advantage of the present invention is that in a semiconductor structure comprising one or more AlSb-alloy layers, the AlSb-alloy layers may be encapsulated or buried below other aluminum-free (or reduced-aluminum-composition) semiconductor, dielectric or metal layers, with the AlSb-alloy layers after encapsulation being chemically converted at least in part to form superposed electrically conducting and insulating portions.

A further advantage is that the present invention is that AlSb-alloy layers within a semiconductor structure may be used to provide an internal patterning or definition of a optoelectronic device structure with the AlSb-alloy layers defining one or more current paths within the device and/or defining (or controlling) one or more electrical or optical characteristics of the device.

Still another advantage of the present invention is that a number of optoelectronic and electronic devices may be formed from the semiconductor structure of the present invention including light-emitting diodes, edge-emitting lasers, vertical-cavity surface-emitting lasers, photodetectors, optical modulators, heterojunction bipolar transistors, field effect transistors and quantum-effect devices.

Yet another advantage is that improved vertical-cavity surface-emitting lasers and resonant-cavity light-emitting diodes operating at a wavelength of about 1.3–1.6 μm or longer may be formed according to the present invention.

These and other advantages of the semiconductor structure of the present invention will become evident to those skilled in the art.

SUMMARY OF THE INVENTION

Accordingly, it is a primary object of the present invention to provide new and improved semiconductor structures having one or more AlSb-alloy layers therein.

An additional object of the present invention is to provide a layered semiconductor structure wherein one or more AlSb semiconductor alloy layers within the layered structure are chemically converted, at least in part, to form superposed electrically conducting and insulating portions.

A further object of the present invention is to provide a layered semiconductor structure having at least one AlSb semiconductor alloy layer therein, with the AlSb-alloy layer being chemically converted at least in part by a lateral oxidation process to form an electrically conducting portion comprising Sb above an electrically insulating portion comprising an oxide of aluminum.

Still another object of the present invention is to provide one or more AlSb-alloy layers as control layers within a semiconductor structure for control an electrical or optical characteristic within the semiconductor structure, with the AlSb-alloy control layers being oxidized at least in part after epitaxial growth of a plurality of semiconductor layers on a substrate.

An additional object of the present invention is to provide a semiconductor structure that may be used for forming improved optoelectronic devices including light-emitting diodes, edge-emitting lasers, vertical-cavity surface-emitting lasers, photodetectors and optical modulators; and especially for use at wavelengths in a range of about 1.3–1.6 μm or longer.

Yet another object of the present invention is to provide a semiconductor structure that may be used to form improved electronic devices such as heterojunction bipolar transistors and field-effect transistors, with the electronic devices including one or more AlSb semiconductor alloy layers oxidized at least in part.

Additional objects, advantages, and novel features of the invention will become apparent to those skilled in the art upon examination of the following description, or may be learned by practice of the invention. The objects and advantages of the invention may be realized and attained by means of the instrumentalities and combinations particularly pointed out in the appended claims.

To achieve the foregoing and other objects, and in accordance with the purposes of the present invention as described herein, a semiconductor structure is provided. The semiconductor structure comprises a plurality of semiconductor layers formed above a substrate and including one or more layers of a III–V compound-semiconductor alloy comprising aluminum (Al) and antimony (Sb) (referred to hereinafter as AlSb-alloy layers) with at least a part of at least one of the AlSb-alloy layers being converted to form an electrically conducting portion comprising Sb overlying an electrically insulating portion comprising an oxide of aluminum. The semiconductor structure preferably further includes at least one overlayer (e.g. a semiconductor, dielectric or metal layer) formed above an uppermost or last-grown AlSb-alloy layer to encapsulate or bury the AlSb-alloy layers. The semiconductor structure may further include one or more aluminum-free layers formed adjacent to each AlSb-alloy layer to separate or surround one or more of the AlSb-alloy layers. Furthermore, according to some embodiments of the present invention a mesa of a predetermined size and shape may be formed within the plurality of semiconductor layers and extend downward at least to one of the buried AlSb-alloy layers, with the mesa having one or more sidewalls wherefrom superposed electrically conducting and insulating portions of the AlSb-alloy layer are formed extending laterally inward. Examples of semiconductor devices that may be formed from the semiconductor structure of the present invention are provided as optoelectronic devices and electronic devices.

Other objects, advantages and novel features-of the invention will become apparent from the following detailed description thereof when considered in conjunction with the accompanying drawings.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings.

DETAILED DESCRIPTION OF THE INVENTION

The present invention is described herein with reference to a series of examples of layered semiconductor structures having superposed electrically insulating and conducting portions formed from at least one AlSb-alloy semiconductor layer.

EXAMPLE 1

Figure 1:
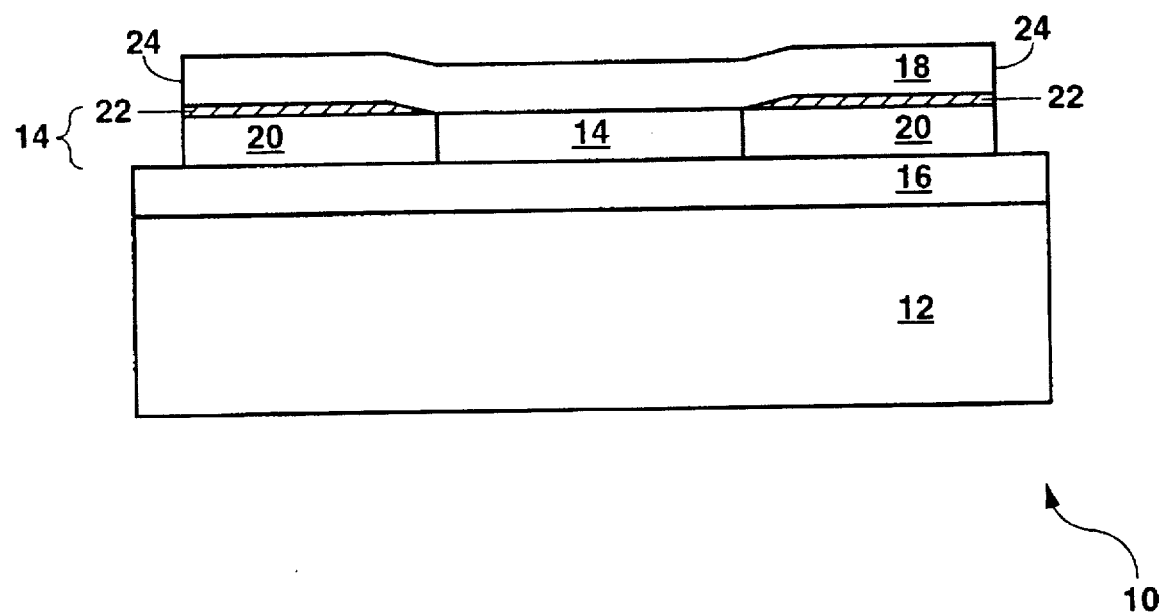
FIG. 1 shows a cross-sectional view of a first example of a semiconductor structure according to the present invention.

Referring to FIG. 1, there is shown a cross-sectional view of a first example of a semiconductor structure 10 according to the present invention. The semiconductor structure in this first example comprises a III–V compound semiconductor substrate 12 (e.g. InP) upon which is epitaxially grown a plurality of monocrystalline semiconductor layers including an AlSb-alloy layer of 14 (e.g. $AlAs_{0.56}Sb_{0.44}$) surrounded by a first-grown semiconductor layer 16 and a last-grown (or cap) semiconductor layer 18. The AlSb-alloy layer 14 in FIG. 1 is at least partially convened by a chemical oxidation process described hereinafter to form an electrically insulating portion 20 and a superposed electrically conducting portion 22 that extends laterally inward from a sidewall 24 of an access region.

The III–V compound semiconductor substrate 12 may be in the form of a water or a portion thereof. The substrate may be either doped with an impurity dopant species (i.e. an n-type or p-type dopant species); or the substrate may be undoped (e.g. semi-insulating). A substrate dopant type and dopant concentration will generally be predetermined according to a particular semiconductor structure 10 to be formed. Suitable substrates 12 according to the present invention may include GaAs, InP, GaSb and InAs, or ternary-alloy substrates (e.g. InGaAs). The substrate 12 as defined heroin may further include one or more buffer layers (generally of the same dopant type of the substrate) epitaxially grown thereon for smoothing or conditioning an upper surface of the substrate or for altering a lattice constant prior to epitaxial growth of the plurality of semiconductor layers thereon.

The AlSb-alloy layer 14 as defined herein may comprise any binary, ternary or quaternary III–V compound semiconductor alloy that includes both aluminum (Al) and antimony (Sb). The AlSb-alloy layer according to some preferred embodiments of the present invention may have a composition that provides for a substantial lattice matching to the substrate 12; whereas for other embodiments of the invention, the AlSb-alloy layer may be compressively or tensile strained. Examples of such AlSb alloys include AlAsSb (e.g. $AlAs_{0.56}Sb_{0.44}$) lattice-matched to an InP substrate; AlPSb lattice-matched to a GaAs substrate; and AlGaSb lattice-matched to either a GaSb substrate or an InAs substrate. In general, the thickness of the AlSb-alloy layer is preferably greater than about 5 nanometers (nm) and may range up to about 1 µm or more, depending on a particular type of semiconductor structure 10 to be formed. The plurality of semiconductor layers, including one or more AlSb-alloy layers 14 may be formed by any epitaxial growth method known to the art including molecular beam epitaxy (MBE), metalorganic chemical vapor deposition (MOCVD) or the like (or combinations thereof).

In the first example of FIG. 1, the AlSb-alloy layer 14 is sandwiched between a first-grown semiconductor layer 16 and a last-grown or cap layer 18. These surrounding layers preferably have a semiconductor alloy composition that is different from that of the AlSb-alloy layer 14 (e.g. either free of aluminum, or having less aluminum in the semiconductor alloy than is present in the AlSb-alloy layer). As an example, on an InP substrate the first-grown semiconductor layer 16 may form an active region for generating or detecting light at a predetermined wavelength, with the AlSb-alloy layer being patterned to define an active area for current flow within the first-grown layer 16. In some embodiments of the present invention, a last-grown semiconductor layer may be replaced by a deposited overlayer of a dielectric material (e.g. a masking layer comprising silicon nitride, silicon dioxide or the like) or a metal for burying at least in part the AlSb-alloy layer 14 during formation of the electrically insulating and electrically conducting portions (20 and 22, respectively).

Epitaxial growth of the semiconductor structure shown in the first example of FIG. 1 may proceed, for example, by MBE growth on an InP substrate at a growth temperature of about 520° C. Group V elements may be provided in the tetramer form (i.e. $As_4$ and $Sb_4$) for epitaxial growth of the plurality of semiconductor layers, with a first effusion cell in an MBE growth apparatus controlling an arsenic overpressure, and a second effusion cell operating at a low temperature to provide a predetermined flux of Sb for growth of the AlSb-alloy layer. Since a growth rate for each of the semiconductor layers is determined primarily by an arrival rate (i.e. a flux) of Al or Ga atoms, the Al and Ga fluxes are preferably adjusted prior to MBE growth of the layers. This may be accomplished, for example, by growing alternating binary-alloy layers of GaAs and AlAs on a separate GaAs measurement substrate and determining the Al and Ga fluxes from reflection high-energy electron diffraction (RHEED) measurements during growth of the binary-alloy layers. During MBE growth of the plurality of semiconductor layers of the structure 10, the alloy composition of each layer may be determined by x-ray diffraction measurements, with the alloy composition being controlled during growth by beam equivalent pressure measurements of the $Sb_4$ flux while maintaining a fixed overpressure of $As_4$ flux.

After formation of the plurality of semiconductor layers on the substrate 12, a masking layer (e.g. silicon nitride, silicon dioxide, photoresist or the like) may be deposited above the plurality of semiconductor layers and lithographically patterned for use in defining one or more semiconductor devices therein. (A masking layer such as silicon nitride that is capable of withstanding a high temperature of about 300°–400° C. may be preferred, since such a masking layer may be left on the substrate during a chemical oxidation process to protect an upper surface of the semiconductor layers, with the masking layer being subsequently removed by etching.) The patterned masking layer (not shown in FIG. 1) provides for etching (e.g. reactive ion etching) down through the plurality of semiconductor layers at least to the buried AlSb-alloy layer thereby forming one or more access regions (e.g. trenches) and exposing the AlSb-alloy layer for oxidation thereof to form superposed electrically insulating and electrically conducting portions (20 and 22, respectively) that extend laterally inward from at least one etched sidewall 24 of each access region. According to some embodiments of the present invention, the patterned masking layer may allow formation of a mesa of a predetermined size and shape, with the mesa having one or more sidewalls 24 wherefrom the AlSb-alloy may be laterally oxidized.

The chemical oxidation process converts at least a part of the AlSb-alloy layer 14 into the electrically insulating portion 20 comprising an oxide of aluminum (i.e. $Al_xO_y$) and the electrically conducting portion 22 comprising Sb (or an Sb-rich material such as an antimony oxide). After etching down to expose one or more AlSb-alloy layers 14, the oxidation process may be carried out by placing the substrate 12 into a container, heating the substrate to a predetermined temperature and exposing the substrate to a controlled environment having a high humidity for sufficient time to form superposed layers 20 and 22. The high humidity (i.e. moist) environment may be provided, for example, by flowing or bubbling a gas, such as nitrogen, through water heated to about 80°–95° C. to entrain water vapor, and then directing the moisture-laden gas into the container.

If the AlSb alloy contains aluminum as the only group III element therein, then the predetermined temperature is preferably between about 300° and 375° C. Alternately, when aluminum is not the only group III element in the AlSb alloy (e.g. for $Al_xGa_{1-x}Sb$ with x<1), a temperature above about 375° C. may be preferred. For semiconductor structures having multiple AlSb-alloy layers therein with different aluminum compositions in the various layers, a lateral extent of oxidation of each AlSb-alloy layer may vary with the aluminum composition therein, with those layers having the highest aluminum composition being oxidized to the greatest lateral extent.

A rate of oxidation and thus the lateral extent of oxidation of the AlSb-alloy layer depends in part on the predetermined temperature to which the substrate is heated. Thus, the exact time required for formation of the electrically insulating and electrically conducting portions will depend upon both the predetermined temperature and the lateral oxidation extent required for forming a particular optoelectronic or electronic device. For example, at a temperature of 350° C. a time duration of about 1 hour and 45 minutes is sufficient for complete oxidation of a 150–2000 nm thick $AlAs_xSb_{1-x}$ layer 14 within a 100-µm-square mesa. The time duration required for the lateral oxidation process also depends upon the aluminum composition within the AlSb-alloy layer 14, with a rate of oxidation decreasing substantially for a slight decrease in aluminum composition of the AlSb alloy. For this reason, an AlAsSb layer 14 (e.g. $AlAs_{0.56}Sb_{0.44}$) having aluminum as the sole group III element may be preferred for use with an InP substrate 12 over other possible semiconductor layers (e.g. $In_{0.48}Al_{0.52}As$) that may be lattice matched to InP but which include other group III elements therein. (Aluminum-containing layers such as the $In_{0.48}Al_{0.52}As$ layer may be provided in the semiconductor structure 10 in addition to one or more AlSb-alloy layers 14, with the lateral extent of oxidation of each layer being determined, at least in part, by its aluminum composition.)

The rate of oxidation and the lateral extent of oxidation of the AlSb-alloy layer may also be controlled and varied by stress produced by a masking layer (e.g. silicon nitride) or a metallization layer provided above the last-grown semiconductor layer 18. For a patterned silicon nitride masking layer, for example, the lateral extent of oxidation of the AlSb-alloy layer is less (i.e. retarded) below the silicon nitride than for portions of the structure above which the silicon nitride is absent. In general, it is expected that the lateral extent of oxidation of the AlSb-alloy layer 14 will be retarded or advanced depending upon the sign (positive or negative) of any stress field produced proximate to the layer 14. Thus, a masking layer or any other layer that provides a spatially varying stress field may be used to produce a spatially varying pattern in the superposed insulating and conducting portions (20 and 22). This ability to pattern the AlSb-alloy layer during oxidation thereof is expected to be useful for forming many types of optoelectronic and electronic devices (including interconnected 1-dimensional and 2-dimensional electron gas structures).

As shown in FIG. 1, the electrically insulating and conducting portions of the AlSb-alloy layer have a combined layer thickness that generally exceeds that of any remaining unoxidized (i.e. as-grown) portion(s) of layer 14. This larger combined layer thickness is due to a displacement of Sb from the insulating portion 20 as the oxide of aluminum is formed, thereby forming the superposed conducting portion 22. During the oxidation process, Sb having a low solubility in the insulating portion 20 is driven upward to an interface between the AlSb-alloy layer 14 and cap layer 18 (or any other semiconductor, dielectric or metal overlayer or combination of layers formed above layer 14) forming the electrically conducting portion 22 and uplifting the overlying layer 18 as shown in FIG. 1. (Other group V elements such as gallium or phosphorous that may be present in a particular AlSb alloy produce volatile compounds which diffuse through layer 14 during the oxidation process, and are released.) The insulating portion 20 after the oxidation process may have a layer thickness that is about equal to the thickness of as-grown AlSb-alloy layer 14 or slightly smaller; while the thickness of the conducting portion 22 will generally depend on the amount of Sb displaced from the AlSb-alloy layer during formation of the insulating portion 20. For example, an as-grown 248-nm-thick AlAs$_{0.56}$Sb$_{0.44}$ layer 14 after oxidation may form an insulating portion 20 that is about 220–240 nm thick and a conducting portion 22 that is about 70–80 nm thick.

Figure 2A:
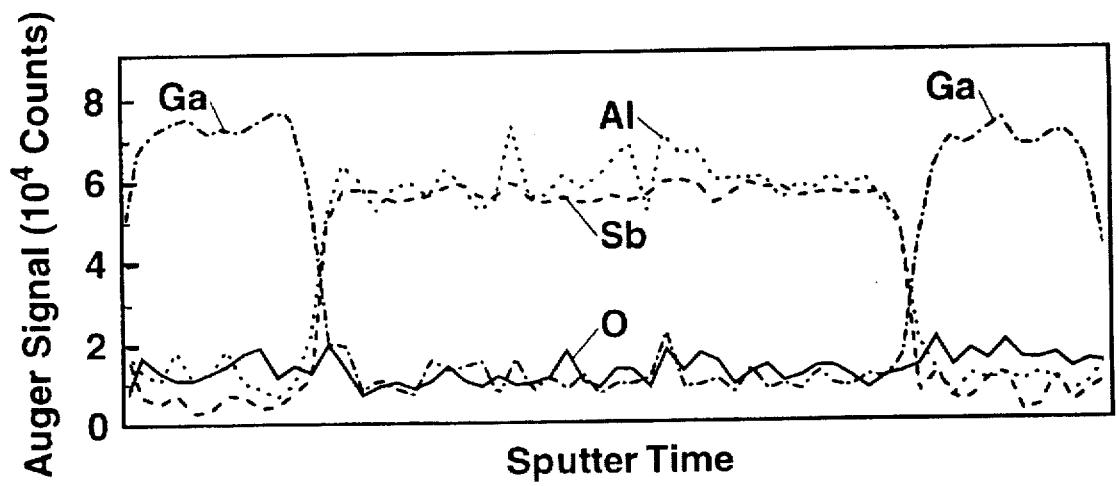
FIGS. 2a and 2b show Auger depth profiles before and after an oxidation process, respectively, for forming the semiconductor structure of FIG. 1.
Figure 2B:
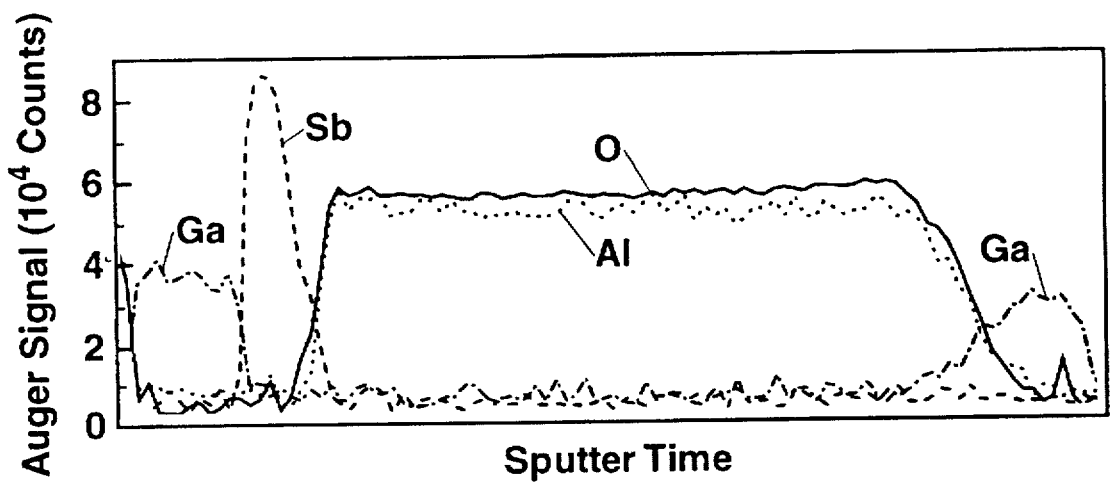

FIGS. 2a and 2b show un-normalized Auger depth profiles for the semiconductor structure in the example of FIG. 1 before and after oxidation of the AlSb-alloy layer. The particular structure used for these Auger measurements comprises a In$_{0.53}$Ga$_{0.47}$As first-grown layer 16 with a layer thickness of about 109 nm, an AlAs$_{0.56}$Sb$_{0.44}$ layer 14 with a layer thickness of about 248 nm and a In$_{0.53}$Ga$_{O.47}$As last-grown layer 18 with a layer thickness of about 109 nm. In FIG. 2, no horizontal scale is shown for the sputter time due to different sputtering rates for the oxidized and as-grown portions of the AlSb-alloy layer. Nonetheless, the Auger profiles of FIG. 2 are useful for discerning the composition and locations of the various layers within the structure before and after the oxidation process.

In the center of the Auger depth profile of FIG. 2a, the as-grown AlSb-alloy layer 14 is indicated by the coincidence of the Al and Sb peaks, with the surrounding layers 16 and 18 are indicated by the Ga Auger peaks. Furthermore, in FIG. 2a there is substantially no oxygen (O) present in any of the as-grown layers. (The curve labelled "O" in FIG. 2a represents a base line noise level for the measurements.) After oxidation, FIG. 2b shows formation of the electrically insulating portion 20 indicated by a coincidence of O and Al.

Auger peaks; and also formation of the electrically conducting portion 22 indicated by an Sb Auger peak between Al and Ga peaks (i.e. between insulating portion 20 and the overlying-cap layer 18). The absence of any O Auger peak coincident with the Sb peak in FIG. 2b indicates that the Sb formed under the conditions of FIG. 2b is in an elemental form and not oxidized. (In other embodiments of the present invention, it may be possible to form an Sb$_x$O$_y$ portion 22.) A quantitative analysis of the Auger data in FIG. 2 with calibration to a known Al$_2$O$_3$ standard further indicates that the oxide of aluminum in the insulating portion is probably Al$_2$O$_3$, a preferred stable oxide having high-quality optical and electrical characteristics for forming semiconductor devices. The curves shown in FIG. 2b are representative of behavior observed for oxidation of the AlAs-alloy layer 14 at a temperature of 350° C. for about 1 hour or for oxidation at 325° C. for about 15.5 hours for etched mesa widths varying from 2 μm to 200 μm.

Cross-section scanning electron micrographs of the semiconductor structure in the example of FIG. 1 show the electrically conducting portion 22 to be predominantly polycrystalline Sb. Raman spectroscopic measurements (not shown) of the AlSb-alloy layer in another semiconductor structure 10 similar to that of FIG. 1 but containing GaAs$_{0.5}$Sb$_{0.5}$ first- and last-grown layers (16 and 18, respectively) with similar oxidation conditions further indicates that the electrically conducting portion 22 generally comprises elemental Sb, especially when the AlSb-alloy layer is AlAs$_{0.56}$Sb$_{0.44}$. From these measurements, a strong Raman peak near 155 cm$^{-1}$ is observed with 514.5 nm focused laser excitation of the electrically conducting portion 20 in an x(y', y'+z')x backscattering configuration, and a weak peak near 140 cm$^{-1}$ is also observed. The 155 cm$^{-1}$ peak agrees well with an expected A$_{1g}$ Raman peak at 150 cm$^{-1}$ for crystalline Sb; and the 140 cm$^{-1}$ peak is indicative of amorphous Sb. Elemental Sb is a semi-metal having a high electrical conductivity, especially when compared to the as-grown AlSb-alloy semiconductor layer 14. In other embodiments of the present invention, it may be possible to control or alter the electrical conductivity of portion 22 by adjusting parameters of the oxidation process to control the relative amounts of amorphous and polycrystalline Sb in the layer, or to form a high-resistivity or even semi-insulating layer comprising in part or entirely an Sb-rich alloy such as antimony oxide.

In the first example of FIG. 1, a lateral oxidation of the AlSb-alloy layer 14 results in the electrically conducting portion 22 being formed above the electrically insulating portion 20. It is thought that this arrangement of the layers 20 and 22 results from energetic considerations which favor deformation of one or more overlayers (e.g. the cap layer 18) rather than deformation of both the overlayers and insulating portion 20 as would occur were portion 22 to be formed below the insulating portion 20. Strain fields generated near the interface between the oxidized (i.e. layers 20 and 22) and unoxidized as-grown portions of the AlSb-alloy layer 14 in the semiconductor structure of FIG. 1 may also lead to a lateral tapering of the electrically conducting portion 22 near this interface as shown in FIG. 1, and the possibility for a lateral migration of Sb for strain compensation. Thus, the exact shape of the electrically conducting portion 22 (and in particular near the interface with the unoxidized as-grown portion of the AlSb-alloy layer) may depend upon a composition and an elasticity of any overlayers in addition to the composition and layer thickness of the as-grown AlSb-alloy layer 14. Furthermore, for some embodiments of the present invention having a sufficiently large overlayer thickness it might be possible to form the electrically conducting portion 22 either superposed below insulating portion 20 or even superposed on both sides of portion 20.

In the absence of the overlying cap layer 18 (e.g. in embodiments of the present invention wherein one or more large-area access regions are etched downward to expose a top surface of an AlSb-alloy layer) it is expected that the electrical conducting portion 22 formed below these access regions might be positioned below the insulating portion 20 due to an oxidation process which proceeds in a substantially vertical direction, since formation of the oxide of aluminum may drive the Sb downward. (For adjacent laterally-oxidized portions of the AlSb-alloy layer, a lateral oxidation process is expected to form the electrically conducting portion 22 above the insulating portion 20.) Thus, it is expected that some control over placement of the electrically conducting and insulating portions of the AlSb-alloy layer may be provided for in the design of particular semiconductor structures and devices by controlling the dimensions and depth of one or more access regions therein in addition to a composition and layer thickness of the AlSb-alloy layer(s) and parameters of the oxidation process.

Various doping configurations are possible for the semiconductor structure in the first example of FIG. 1, depending upon a particular type of semiconductor device to be formed by the structure. For example, the plurality of semiconductor layers in the structure 10 may be doped with impurity dopants to form a p-n or p-i-n junction therein. Such semiconductor junctions are useful for forming optoelectronic devices such as light-emitting diodes or semiconductor lasers (edge-emitting lasers having cleaved end-facet mirrors or vertical-cavity surface-emitting lasers having distributed Bragg reflector mirrors surrounding an active region) that operate by forward-biasing the junction with a voltage applied to electrodes formed above and below the plurality of semiconductor layers; or for forming a photodetector or optical modulator (i.e. a waveguide or surface-normal optical modulator) by reverse-biasing the junction. In such optoelectronic devices, the superposed electrically insulating and conducting portions of the AlSb-alloy layer may define an active region within the first-grown layer 16 (or within any other semiconductor layers proximate to the AlSb-alloy layer).

An advantage of the present invention is that the electrical conducting portion 22 may be used to provide for a lateral current flow within a semiconductor structure formed according to the present invention. An electrical resistivity of the portion 22 comprising Sb may be substantially reduced compared to any doped semiconductor layer overlying the electrical conducting portion 22 thereby increasing the lateral current flow within a particular device. For example, the 109-nm-thick InGaAs cap layer 18 in the structure of FIG. 1 prior to oxidation of the AlSb-alloy layer 14 had a bulk resistivity (from transmission line measurements) of about $1.4 \times 10^{-2}$ $\Omega$-cm for p-type doping to about $5 \times 10^{18}$ cm$^{-3}$ with Be, corresponding to a sheet resistance of about 1300 $\Omega/\square$. However, after oxidation of the AlSb-alloy layer and formation of the electrically conducting portion 22, the measured sheet resistance was reduced to about 35 $\Omega/\square$, indicating that current flow occurred primarily in the Sb conducting portion 22 which had a bulk resistivity of about $2.5 \times 10^{-4}$ $\Omega$-cm (a factor of over 50 lower than the layer 14 prior to oxidation). To provide an equivalent conductivity, the overlying cap layer thickness in the above example (with $5 \times 10^{18}$ cm$^{-3}$ doping) would need to be increased to about 3.6 µm to provide an equivalent sheet resistance to that provided by the conducting portion 22. Such a large cap layer thickness and/or a high doping level therein may not be desirable or feasible for many types of semiconductor devices.

For an electrically conducting portion 22 in contact with an InGaAs overlayer 18, the low resistivity measured and a linearity of current-versus-voltage (I–V) measurements indicated the formation of an Ohmic (i.e. non-rectifying) electrical contact between the portion 22 and InGaAs layer 18. For the electrically conducting portion 22 in contact with other higher-bandgap semiconductor layers (e.g. AlAsSb) or for semiconductor layers having a different dopant concentration or dopant type (e.g. n-doped) it is expected that a Schottky contact may be formed. An ability to form a Schottky contact is especially useful for forming electronic devices such as field-effect transistors with the semiconductor structure 10 of the present invention.

EXAMPLE 2

Figure 3:
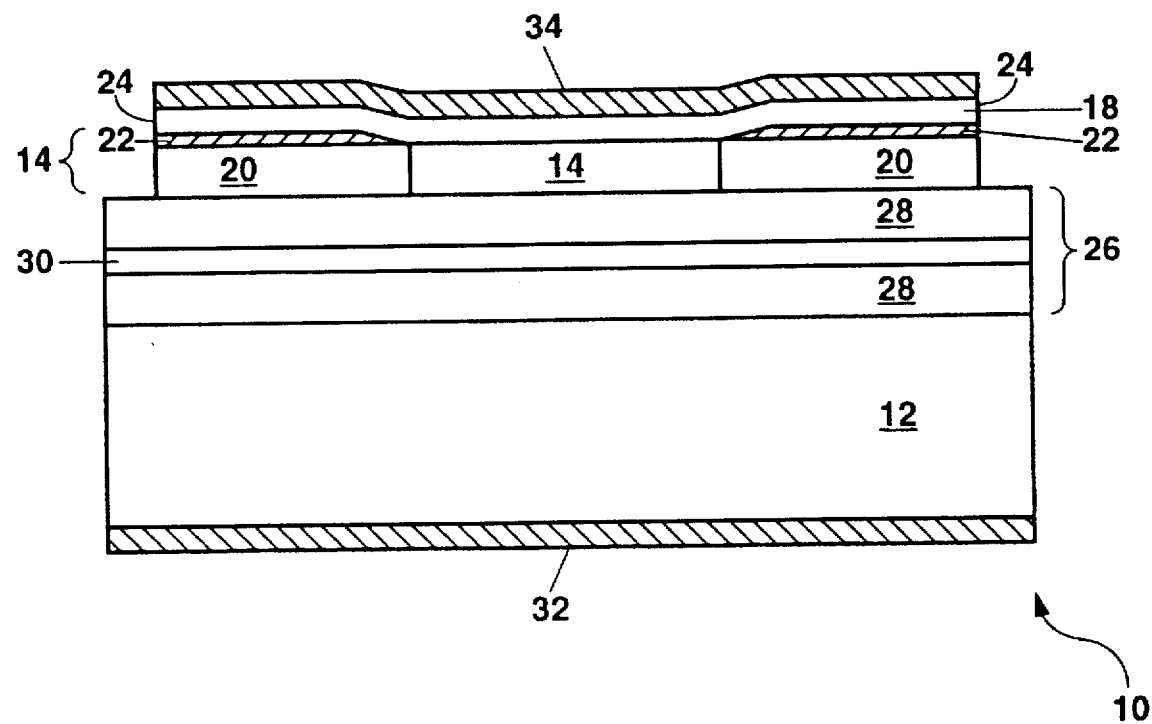
FIG. 3 shows a cross-sectional view of a second example of a semiconductor structure according to the present invention.

FIG. 3 shows a cross-sectional view of a second example of the present invention. In FIG. 3, the layered semiconductor structure 10 is similar to that of FIG. 1 except for replacement of the first-grown layer 16 by an active region 26. The active region may either comprise a single layer (e.g. a bulk layer having a thickness of up to a few wavelengths of the light to be generated, detected or modulated), or multiple semiconductor layers (e.g. a pair of cladding layers 28 surrounding an active layer 30 as shown in FIG. 3). Also, in FIG. 3 electrodes 32 and 34 are formed above and below the active region for electrically contacting the structure 10.

In FIG. 3, the active region 26 preferably has an average lattice constant (defined herein as an average over the lattice constants for each layer within the active region multiplied by the fraction of the total thickness of the active region provided by that layer) that is lattice matched to the substrate 12.

An active region 26 for forming an optoelectronic device from the structure 10 for generating, detecting or modulating light within a wavelength range of about 1.3–1.6 µm may be formed, for example, on an n-doped (about $10^{18}$ cm$^{-3}$ or higher) InP substrate 12 with the active region comprising a bulk layer of about 1 µm or greater thickness of a III–V compound semiconductor such as a ternary alloy of InGaAs (e.g. $In_{0.53}Ga_{0.47}As$) or GaAsSb, or a quaternary alloy of InGaAsP (e.g. $In_{1-x}Ga_xAs_yP_{1-y}$ with x/y=0.45). Such a bulk active region may be sandwiched between the InP substrate and the as-grown AlSb-alloy layer 14 (e.g. $AlAs_{0.56}Sb_{0.44}$), with the active region preferably having a bandgap energy that is less than that of the surrounding InP substrate and the AlSb-alloy layer, and a p-n or p-i-n junction formed within or about the active region.

As another example, the active region 26 may include a pair of cladding layers 28 (e.g. about 1 µm of InP or $In_{0.52}Al_{0.48}As$) as shown in FIG. 3 surrounding one or more active layers 30 (e.g. InGaAs, GaAsSb, or InGaAsP), with the cladding layers having a bandgap energy larger than the bandgap energy of the active layers. Furthermore, the cladding layers 28 may have a semiconductor alloy composition that is uniform in the growth direction, forming a separate confinement heterostructure (SCH) active region 26; or the composition of the cladding layers 28 may be graded in the growth direction (i.e. graded from a higher-bandgap to a lower-bandgap alloy composition for the first-grown cladding layer, and graded from a lower-bandgap alloy to a higher-bandgap composition for the second-grown cladding layer), forming a graded-index separate confinement heterostructure (GRIN-SCH) active region 26.

In the example of FIG. 3, the first-grown cladding layer preferably has a doping type that is the same as the underlying substrate 12 (e.g. n-type doped to about $5 \times 10^{17}$ cm$^{-3}$); and the second-grown cladding layer is preferably doped oppositely (e.g. p-type doped to about $5 \times 10^{17}$ cm$^{-3}$) forming a semiconductor p-n or p-i-n junction across the active region 26. The active layer 30 is preferably undoped (i.e. intrinsic or unintentionally doped). The layers above the second-grown cladding layer (including the as-grown portion of layer 14) are doped with the same dopant type as the second-grown cladding layer.

The active layer 30 may be a bulk layer (e.g. of InGaAs, GaAsSb, InGaAsP or the like); or alternately the active layer may include a plurality of quantum-well layers separated by higher-bandgap barrier layers (e.g. InGaAsP). (A quantum-well layer is defined herein as a semiconductor layer providing a quantum confinement of electrons and holes therein by means of one or more quantum wells, quantum wires, or quantum dots). In some embodiments of the present invention, the quantum-well and barrier layers may be oppositely strained forming a strain-balanced active region 26 having an average lattice constant that is substantially matched to the lattice constant of the substrate (i.e. an average of the lattice constants over all the layers within the active region is matched to the substrate, while individual layers within the active region are compressively or tensile strained).

In the second example of the present invention in FIG. 3, a lower electrode 32 is formed below the active region and an upper electrode 34 is formed above the cap layer 18 which may be InGaAs, InGaAsP or the like doped to $10^{18}$ cm$^{-3}$ or higher. For an n-type InP substrate, Au—Ge—Ni may be deposited below the substrate and annealed to form the lower electrode 32; and Ti—Pt—Au, Au—Be, Au—Zn or the like may be used for forming the upper electrode 34. For some embodiments of the present invention forming vertically oriented devices (e.g. vertically emitting light-emitting diodes or photodetectors) at least one of the electrodes may be lithographically patterned for transmitting light therethrough (e.g. by means of an aperture formed into the electrode) and/or for independently contacting a plurality of devices formed on a wafer (individual devices may be electrically isolated, for example, by the etched access regions). For other embodiments of the invention, such vertically-oriented devices may be formed with at least one partially-transmitting electrode (e.g. indium-tin oxide). (In the 1.3–1.6 μm wavelength range an InP substrate is transparent so that the apertured or partially-transmitting electrode could be located above or below the active region, or both.)

Edge-emitting or detecting devices may also be formed with the semiconductor structure shown in the example of FIG. 3. In this case, the substrate is preferably etched or cleaved to form a pair of end-facet mirrors which may then be coated to provide predetermined reflectivities for one or both of the end-facet mirrors depending on a particular type of device to be formed (e.g. a waveguide detector, waveguide optical modulator or an edge-emitting laser).

The patterned AlSb-alloy layer in the second example of FIG. 3 serves as a control layer within the structure 10, controlling electrical and/or optical characteristics of a device formed from the structure. For example, the superposed electrically insulating and conducting portions (20 and 22) of the AlSb-alloy layer may define an active area of the active region 26 by controlling the application of a forward-bias current flow therein or a reverse-bias voltage thereacross. For light-emitting devices such a control layer is particularly advantageous for efficiently channeling current into the active region and concentrating the current, thereby generating light more efficiently and/or reducing a lasing threshold current. Furthermore, for waveguide devices such as edge-emitting lasers a reduced index of refraction of an insulating portion 20 formed on either side of a stripe-shaped unoxidized portion of the AlSb-alloy layer 14 may be used to provide a lateral refractive index step for defining an optical waveguide (e.g. an index guide) within the adjacent active region.

EXAMPLE 3

Figure 4:
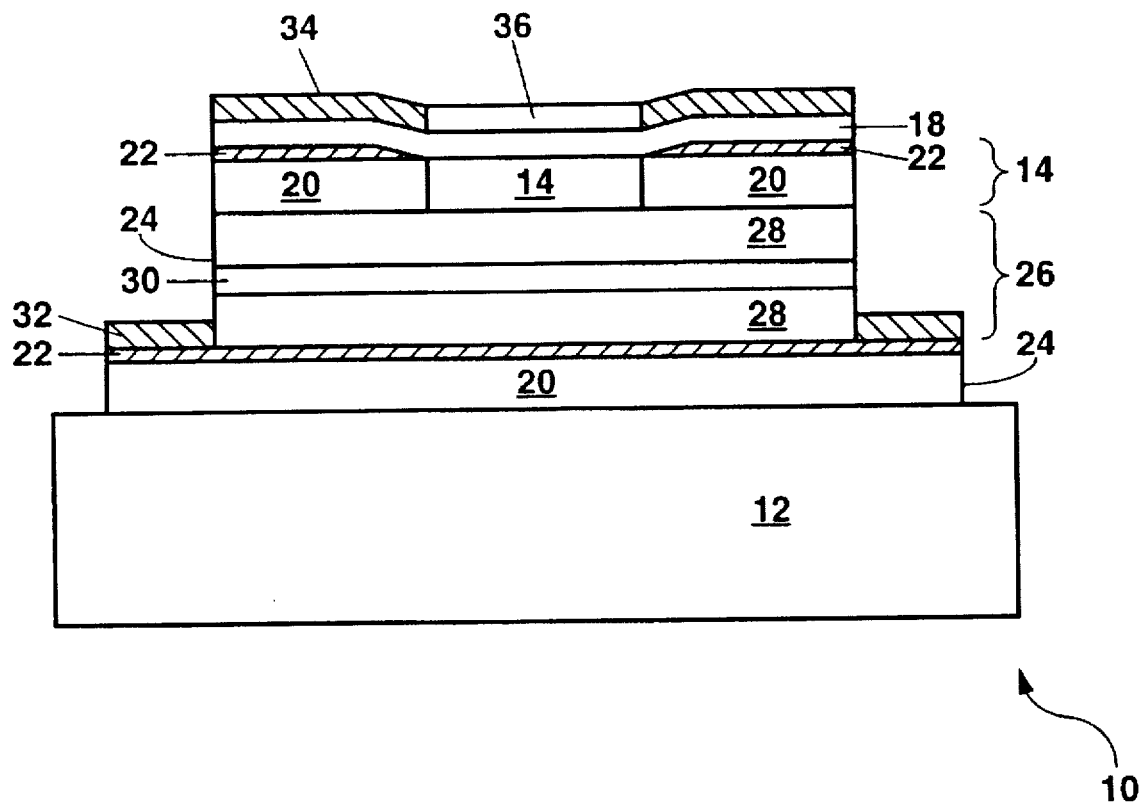
FIG. 4 shows a cross-sectional view of a third example of a semiconductor structure according to the present invention.

FIG. 4 shows a cross-sectional view of a third example of the present invention. In FIG. 4, a first-grown AlSb-alloy layer 14 is epitaxially grown below an active region 26 and a second-grown AlSb-alloy layer is grown above the active region. In FIG. 4, the first-grown AlSb-alloy layer is completely converted into superposed electrically insulating and conducting portions (20 and 22, respectively) for providing a lower electrical connection between the active region and a lower electrode 32. A stepped mesa may be formed and the lower electrode deposited above the first-grown AlSb-alloy layer and patterned to encapsulate the first-grown layer 14 prior to the oxidation process. (In some embodiments of the present invention, it may be possible to simultaneously form the upper and lower electrodes in a single deposition step; with the upper electrode, for example, forming an Ohmic contact to cap layer 18 and the lower electrode forming a Schottky contact to conducting portion 22.) Differences in a lateral extent of oxidation of the two AlSb-alloy layers in FIG. 4 may be accomplished, for example, by providing different semiconductor alloy compositions for the two layers, with the greater lateral extent of the first-grown AlSb-alloy layer resulting from a higher aluminum composition therein. The remaining elements shown in the third example of FIG. 4 may be selected according to the information presented heretofore with particular layer compositions, thicknesses, and energy bandgaps being predetermined according to a particular optoelectronic device to be formed with the teaching of the present invention.

The structure in the example of FIG. 4 advantageously reduces a series resistance within the structure and improves an operating speed and efficiency of the structure by providing a high-conductivity current path below the active layer 26, and a current channel formed thereabove by an unoxidized portion of the second-grown AlSb-alloy layer 14. Also, the electrically insulating portion 20 of the first-grown AlSb-alloy layer serves to electrically isolate the plurality of semiconductor layers in the structure 10 from the underlying substrate 12, further increasing the operating speed of the structure, and allowing the formation of a plurality of isolated devices on a common substrate 12. Another advantage of the semiconductor structure 10 in the example of FIG. 4 is that the conducting portion 22 formed below the active region 26 may act as a partially reflecting mirror to increase an amount of light emitted vertically upward in the case of a light-emitting diode, or to redirect downward propagating light back through the active region and thereby increase a detection efficiency for the light (especially when the active region is optically thin).

In the example of FIG. 4, the upper electrode 34 is shown with an aperture 36 formed therein to allow light to be directed vertically into or out from the active region 26 for forming surface-normal optoelectronic devices. In other embodiments of the present invention, the apertured (or annular) upper electrode may be replaced by a uniformly-deposited electrode for forming edge-emitting lasers or waveguide devices (e.g. waveguide photodetectors, light-emitting diodes or optical modulators).

EXAMPLE 4

Figure 5:
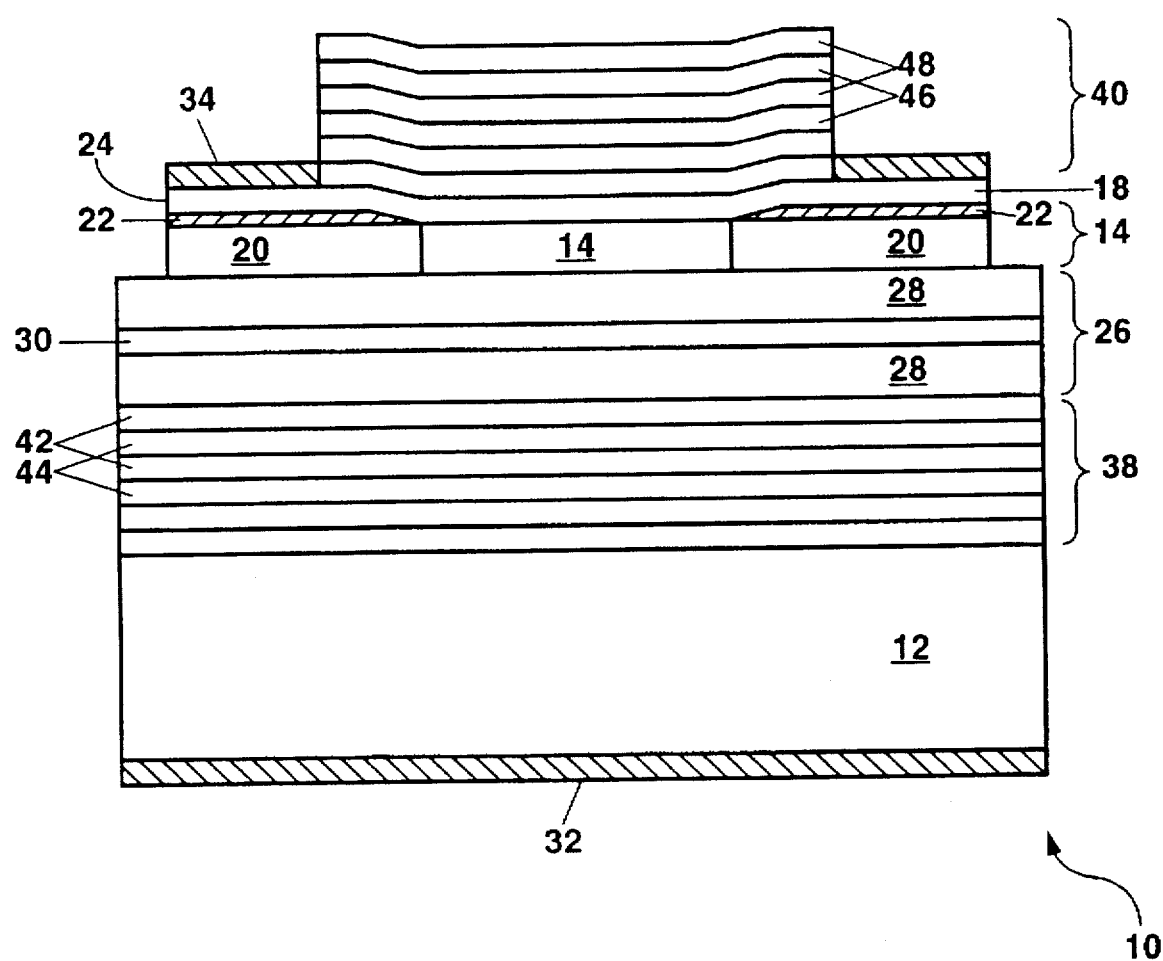
FIG. 5 shows a cross-sectional view of a fourth example of a semiconductor structure according to the present invention.

FIG. 5 shows a cross-sectional view of a fourth example of the present invention. In FIG. 5, a plurality of semiconductor layers are epitaxially grown on substrate 12 including in order a first a semiconductor distributed-Bragg-reflector (DBR) stack mirror 38, an active region 26, at least one AlSb-alloy layer 14 and a last-grown semiconductor layer 18. A dielectric DBR stack mirror 40 is formed above the cap layer by a deposition process after epitaxial growth of the semiconductor layers and formation of the superposed electrically insulating and conducting portions (20 and 22, respectively). The DBR mirrors (38 and 40) form a resonant optical cavity about the active region 26, with the AlSb-alloy layer 14 within the cavity acting to define electrical and optical characteristics of an optoelectronic device formed from the structure 10. The semiconductor structure 10 of FIG. 5 is particularly useful for forming vertical-cavity surface-emitting lasers (VCSELs), resonant-cavity light-emitting diodes (RCLEDs), resonant-cavity photodetectors (RCPDs), and resonant-cavity modulators (RCMs).

In the fourth example of FIG. 5, the semiconductor DBR mirror 38 comprises a plurality of pairs (i.e. mirror periods) of alternating high-bandgap semiconductor layers 42 and low-bandgap semiconductor layers 44; with a dopant type that is generally the same as that of the substrate (e.g. n-type doped to about $10^{18}$ cm$^{-3}$). The epitaxial growth of the semiconductor DBR mirror 38 is generally terminated with a high-bandgap semiconductor layer 42. In some instances, however, the growth may be terminated with a low-bandgap semiconductor layer 44 to provide for positioning of an electric field antinode or node (i.e. maxima and minima of the electric field, respectively) of light within the resonant optical cavity at an axial position near one or more quantum-well layers within the active region 26.

The semiconductor alloy composition, layer thickness, and number of the high-bandgap and low-bandgap semiconductor layers (42 and 44, respectively) in DBR mirror 38 are selected to provide a reflectivity of about 90% or higher over a wavelength range of the light to be generated, detected or modulated by an optoelectronic device having the structure 10 of FIG. 5. The wavelength range for operation of the structure is preferably matched to a predetermined gain spectrum of the active region over a range of operating temperatures. For embodiments of the invention formed on an InP substrate for operation in the wavelength range of about 1.3–1.6 µm, the high-bandgap semiconductor layers 42 may be, for example, AlAsSb (e.g. AlAs$_{0.56}$Sb$_{0.44}$), InAlAs (e.g. In$_{0.52}$Al$_{0.48}$As) or InP; and the low-bandgap semiconductor layers 44 may be, for example, InGaAs (e.g. In$_{0.53}$Ga$_{0.47}$As), GaAsSb (e.g. with an alloy composition lattice-matched to InP) or InGaAsP (e.g. In$_{1-x}$Ga$_x$As$_y$P$_{1-y}$ with x/y=0.45). Other III-V semiconductor alloy compositions known to the art may be used for forming structures for operation at other wavelength ranges (e.g. with GaAs, GaSb or InAs substrates). In general, the compositions of layers 42 and 44 are selected for lattice matching to the substrate while providing a relatively large difference in refractive indices, Δn, between the layers 42 and 44 to reduce the number of mirror periods required to attain a predetermined reflectivity for the semiconductor DBR mirror 38.

The layer thicknesses within the semiconductor DBR mirror 38 are preferably selected to provide an optical thickness (defined herein as an actual or as-grown layer thickness multiplied by a refractive index, n, of the layer) that is about one-quarter of the wavelength of the light to be generated, detected or modulated by the structure 10 so that a reflection of light from each mirror period (i.e. each pair of alternating high-bandgap and low-bandgap semiconductor layers) is additive. The number of mirror periods within DBR mirror 38 will in general depend on a predetermined reflectivity for the mirror, with only a few mirror periods being required if the refractive index difference between the high-bandgap and low-bandgap semiconductor layers is large (e.g. Δn~0.5).

The active region 26 and the AlSb-alloy layer 14 (and insulating and conducting portions formed therefrom) have a design and function similar to that of the examples of the invention described heretofore. After epitaxial growth of the semiconductor layers, the layers are patterned and etched to form a mesa having one or more sidewalls 24 wherefrom the electrically insulating and conducting portions (20 and 22, respectively) are formed extending laterally inward into the as-grown AlSb-alloy layer 14. Insulating portion 20 generally forms an annular current-blocking region centered about a vertically-oriented optical axis of the structure; whereas conducing portion 22 forms a current flow region for directing a flow of current from upper electrode 34 through the unoxidized portion of the AlSb-alloy layer 14 and into the active region 26. The insulating, conducting and unoxidized portions of layer 14 act in combination to form a control layer which defines an active area of the active region that is centered about the optical axis with a size and shape about that of the unoxidized portion of layer 14. In the case of VCSELs formed according to the present invention, the portions 20 and 22 further provide a lateral refractive index step (i.e. a lateral difference in refractive indices, Δn, between the oxidized and as-grown portions of layer 14) that may be used to define and control lasing modes within the device, thereby providing in some embodiments of the present invention for lasing in a single lateral mode. This lateral refractive index step may also act as a lens to control a divergence or angular spread of light emitted from a VCSEL or RCLED.

In FIG. 5, the last-grown semiconductor layer 18 serves as a cap layer for forming a contact to an annular upper electrode 34 and is preferably doped to about $10^{18}$ cm$^{-3}$ or higher (with a dopant type opposite that of the substrate). The composition and thickness of the AlSb-alloy layer 14 and the cap layer 18 are preferably selected to provide an effective optical thickness between the DBR mirrors that is an integral multiple of one half of the wavelength of light for which the structure is to be used. The layer thickness of the AlSb-alloy layer may be further selected to place the conducting portion 22 at a location corresponding to a node of the electric field of the light within the optical cavity to minimize any optical loss within the cavity due to the presence of the conducting portion. In some embodiments of the present invention, the AlSb-alloy layer and the cap may have high and low energy bandgaps, respectively, thereby forming a mirror period to enhance a reflectivity of the overlying dielectric DBR mirror 40.

In the fourth example of the present invention in FIG. 5, the dielectric DBR mirror 40 comprises alternating layers of a low-refractive index dielectric layer 46 and a high-refractive index dielectric layer 48 deposited above the last-grown semiconductor layer 18. Each layer of the dielectric DBR mirror has an effective optical thickness that is preferably substantially one-quarter-wavelength thick (or an odd multiple thereof) and comprises an amorphous or polycrystalline dielectric material as known to the art.

An advantage of forming an semiconductor structure 10 as in the example of FIG. 5 is that a reflectivity and/or a center wavelength (i.e. a wavelength about which a reflectivity curve of the dielectric DBR mirror is centered, and which preferably corresponds to a gain peak of the active region 26) of the dielectric DBR mirror 40 may be determined after epitaxial growth of the plurality of semiconductor layers and a characterization thereof (e.g. a measurement the gain peak and/or a reflectivity curve of the semiconductor DBR mirror 38). Another advantage of the fourth example of the present invention is that a series electrical resistance within the semiconductor structure 10 may be reduced by providing an upper electrode 34 that is close to the active region 26, with the electrical current passing through only a very few semiconductor layers before reaching the active region. Yet another advantage of this fourth example of the present invention is that a plurality of optoelectronic devices may be formed on a semiconductor wafer, with adjacent devices being of different types, defined at least in part by a selective deposition or patterning of the second DBR mirror thereon. For example, some devices (e.g. RCLEDs or RCPDs) may be formed on one part of a wafer by omitting the dielectric DBR mirror 40 or otherwise by providing only a few mirror periods of alternating layers 46 and 48; whereas other devices (e.g. VCSELs or RCMs) may be formed on other parts of the same wafer by providing a dielectric DBR mirror 40 comprising a larger number of mirror periods (and thus a higher reflectivity). In some cases, it may be desirable to form a plurality of semiconductor structures on a common substrate or wafer for operation at different wavelengths. This may be achieved, for example, by varying the layer thicknesses of a plurality of dielectric DBR mirrors formed across a wafer during deposition thereof, forming a plurality of chirped-wavelength devices. Such chirped-wavelength devices have applications, for example, for frequency multiplexing or demultiplexing of optical signals for generation or detection thereof (e.g. to provide a plurality of one- or two-way channels of optical communication through optical fibers or free space), with each channel operating at a slightly different wavelength.

EXAMPLE 5

Figure 6:
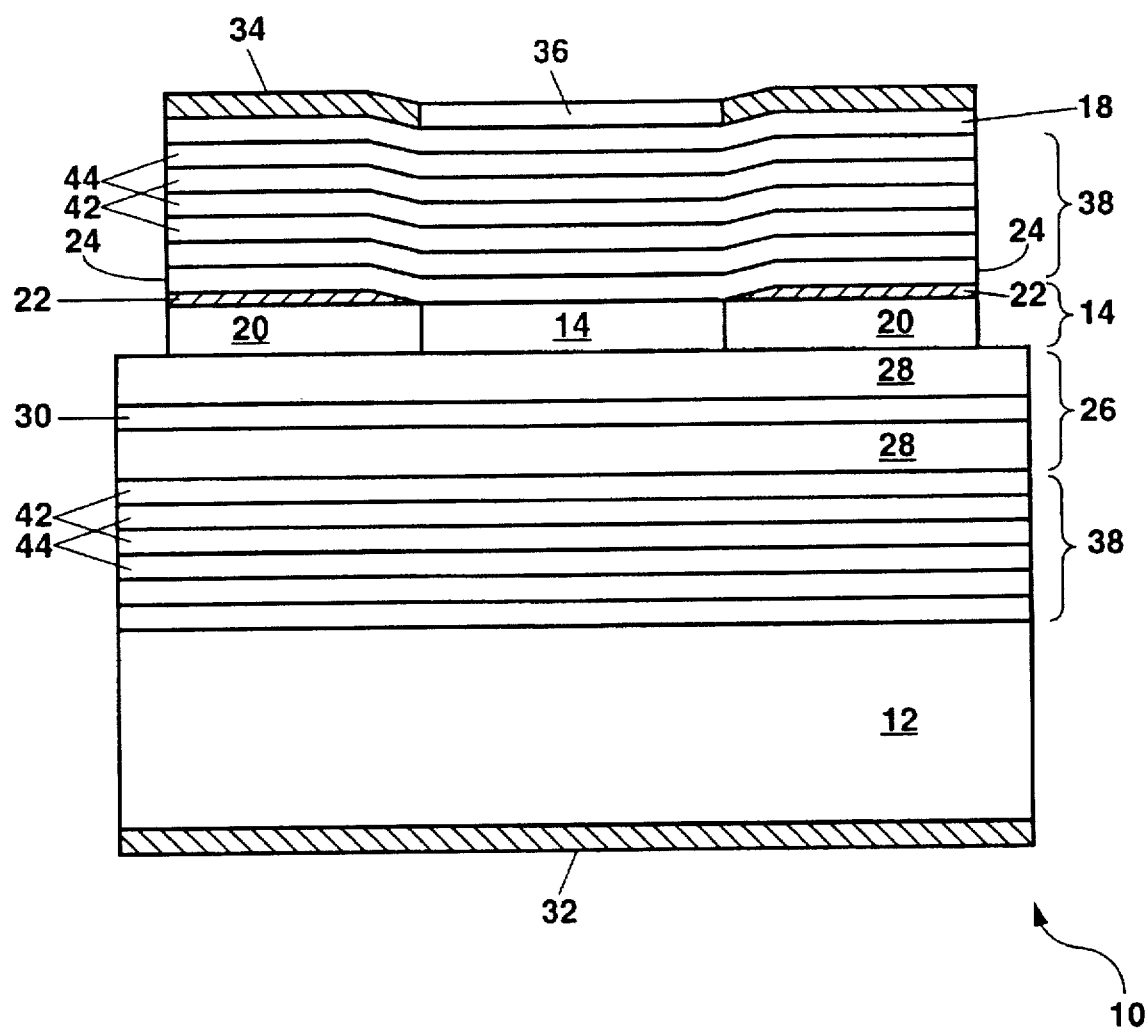
FIG. 6 shows a cross-sectional view of a fifth example of a semiconductor structure according to the present invention.

FIG. 6 shows a cross-sectional view of a fifth example of the present invention. In FIG. 6, a semiconductor structure 10 is shown comprising a plurality of semiconductor layers grown on a substrate 12 and including a pair of semiconductor DBR stack mirrors 38 with an active region and at least one AlSb-alloy layer sandwiched therebetween. The DBR mirrors form a resonant optical cavity surrounding the active region 26, with the AlSb-alloy layer within the cavity forming a control layer for defining, at least in part, electrical and optical characteristics of an optoelectronic device formed from the structure 10. The semiconductor structure 10 of FIG. 6, similar to that of FIG. 5 except for the DBR mirrors 38 being epitaxially grown, has applications for forming VCSELs, RCLEDs, RCPDs, RCMs or the like.

In FIG. 6, each semiconductor DBR mirror 38 comprises a plurality of pairs (i.e. mirror periods) of alternating high-bandgap semiconductor layers 42 and low-bandgap semiconductor layers 44. The number of mirror periods of each semiconductor DBR mirror will be predetermined depending on a particular type of optoelectronic device to be formed. The first-grown DBR mirror 38 (i.e. the first DBR mirror) in the example of FIG. 6 is doped with a dopant type that is generally the same as that of the substrate (e.g. n-type doped to about $10^{18}$ cm$^{-3}$); whereas the second-grown DBR mirror 38 (i.e. the second DBR mirror) has the opposite dopant type. The first few pairs of semiconductor layers of each DBR mirror nearest to the active region 26 may be grown with a reduced doping concentration as compared to the remaining pairs of layers to reduce an optical loss in the resonant cavity due to dopant impurity absorption and scattering. Furthermore, interfaces between layers of one or both of the semiconductor DBR mirrors may be composition graded to reduce a series resistance therein.

In the example of FIG. 6, the as-grown AlSb-alloy layer 14 has a thickness that in combination with the underlying active region 26 provides an optical thickness that is preferably an integral multiple of one-half of the wavelength of light to be generated, detected or modulated with the structure 10. In some embodiments of the present invention, the AlSb-alloy layer may have a high energy bandgap (e.g. for an AlAs$_{0.56}$Sb$_{0.44}$ layer 14) thereby forming a high-bandgap layer of the second DBR mirror; and the last-grown semiconductor layer 18 may have a low energy bandgap (e.g. for an In$_{0.53}$Ga$_{0.47}$As layer 18) forming a low-bandgap layer of the second DBR mirror.

The lower and upper electrodes (32 and 34, respectively) may be formed from an opaque metallization (i.e. optically thick), a semi-transparent metallization (e.g. indium-tin-oxide) or a metallization patterned to define an aperture 36 therethrough. The particular type of metallization for each electrode will in general depend upon the type of optoelectronic device to be formed from the structure 10 and the vertical direction in which light is to be generated, detected or directed. If the light is to be emitted or from the top of the structure 10 as shown in FIG. 6, then a patterned or semi-transparent metallization is preferred for the upper electrode 34. Alternately, if the light is to be emitted or received through the bottom of the device (i.e. through a transparent substrate 12), then the lower electrode 32 preferably comprises a patterned or semi-transparent metallization; and the upper electrode 34 may be an opaque metallization. In some embodiments of the present invention, the etched access region(s) forming sidewalls 24 of the mesa may be filled in with a dielectric material (e.g. polyimide, spin-on glass or the like) prior to deposition of the upper electrode for planarizing, protecting and/or passivating the semiconductor structure 10.

The semiconductor structure 10 shown in the example of FIG. 6 is advantageous for forming many types of optoelectronic devices including VCSELs for operation in the wavelength range of 1.3–1.6 µm, or other predetermined wavelength ranges (e.g. wavelengths longer than 1.6 µm for devices formed on an InAs or GaSb substrate). The formation of electrically insulating and conducting portions within the AlSb-alloy layer 14 may allow continuous operation of VCSELs within the 1.3–1.6 µm wavelength range or longer by providing an efficient and directed flow of an electrical current into the active region and by defining a small active area with lateral dimensions of a few microns. Such VCSELs formed according to the present invention are expected to be well-suited for optical fiber communications since they will provide a low-divergence lasing output beam (generally circular in shape) that may be matched to an acceptance angle of an optical fiber.

EXAMPLE 6

Figure 7:
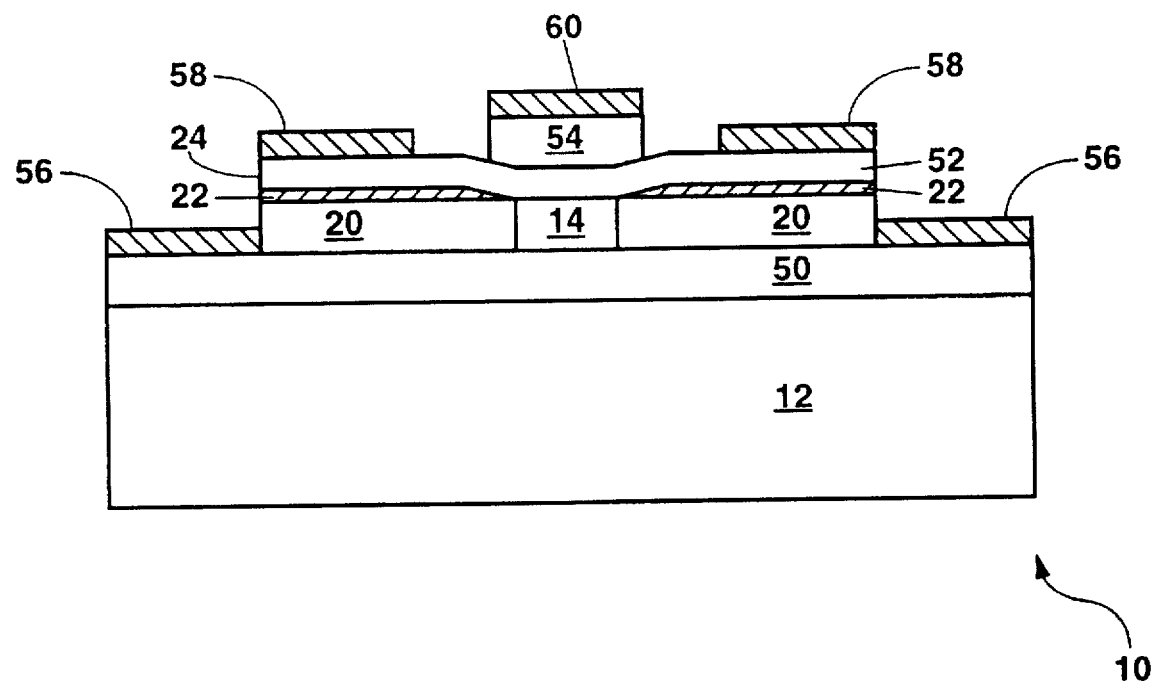
FIG. 7 shows a cross-sectional view of a sixth example of a semiconductor structure according to the present invention in the form of a heterojunction bipolar transistor.

FIG. 7 shows a cross-sectional view of a sixth example of the present invention. In FIG. 7, the semiconductor structure 10 comprises a plurality of semiconductor layers grown on a substrate 12 (e.g. InP, GaAs, or the like) for forming a heterojunction bipolar transistor (HBT). The semiconductor layers in the example of FIG. 7 include in order a sub-emitter layer 50 (e.g. an InP layer epitaxially grown on an InP substrate), an AlSb-alloy layer 14 (e.g. AlAsSb) having an unoxidized portion forming an emitter of the HBT, a base layer 52 (e.g. InGaAs) and a collector layer 54 (e.g. InGaAs, InP or InAlAs). After epitaxial growth of the layers, a mesa is formed with sidewalls 24 wherefrom the AlSb-alloy layer 14 is oxidized forming superposed electrically insulating and conducting portions (20 and 22, respectively). A dry annealing step (e.g. in an atmosphere comprising a vacuum, an inert gas such as argon, or a forming gas) may be provided if necessary to reduce any electrical traps formed at an interface between the insulating portion 20 and sub-emitter layer 50 or between the insulating portion 20 and the unoxidized portion 14 forming the emitter. Electrodes 56, 58 and 60 are deposited on exposed portions of sub-emitter layer 50, base layer 52 and collector layer 54 and patterned for providing emitter, base and collector contacts to the HBT device. (For some embodiments of the present invention, it may be preferable to locally pattern and etch base layer 52 to reduce its thickness (or completely remove it) below one or more electrodes 58 to reduce an electrical contact resistance to the transistor base.) The emitter and collector may be circular, rectangular or stripe-shaped in plan view.

To form an n-p-n transistor structure 10, the sub-emitter layer 50, AlSb-alloy layer 14 and collector layer 54 are n-type doped during growth, with the base layer 52 being p-type doped. An unoxidized as-grown portion of the AlSb-alloy layer 14 forms an emitter for the HBT, with the base and collector layers forming a base and a collector, respectively. The sub-emitter layer 50 underlying the AlSb-alloy emitter is used to provide an electrical connection between the emitter and emitter electrode(s) 56.

According to the present invention, the electrically conducting portion 22 underlying base layer 52 advantageously increases an electrical conductivity (and reduces an extrinsic base resistance) of the base layer thereby increasing a speed of operation of the transistor. (A tapering of the conducting portion 22 near the as-grown portion of the AlSb-alloy emitter may help to prevent any direct electrical contact between the portion 22 and the emitter.) Furthermore, electrically insulating portion 20 advantageously reduces a current leakage and a base-emitter capacitance between the base and emitter layers of the transistor further increasing the speed of the device.

For this sixth example of the present invention, the substrate 12 may be InP, GaAs or the like (preferably semi-insulating). As an example, for forming an n-p-n HBT on an InP substrate the sub-emitter layer may comprise n-doped InP; the AlSb-alloy may comprise n-doped $AlAs_{0.56}Sb_{0.44}$; the base layer 52 may comprise p-doped $In_{0.53}Ga_{0.47}As$; and the collector layer may comprise n-doped $In_{0.53}Ga_{0.47}As$. Other types of electronic devices may be formed with modifications to the structure 10 in the example of FIG. 7 as will become evident to those skilled in the art. For example, p-n-p HBTs may be formed by switching the dopant types of the layers; metal base transistors may be formed by using the conducting portion 22 to form the transistor base; and vertical field-effect transistors (FETs) may be formed by leaving layer 52 undoped or lightly doped (about $10^{15}$–$10^{16}$ cm$^{-3}$) and doping the remaining layers with the same dopant type so that layers 14 and 54 may be used to form a drain and source of the FET, respectively; and portion 22 forming a gate of the FET. Additionally, interface grading may be provided during epitaxial growth to reduce any abrupt heterojunction energy barriers between the layers in the semiconductor structure 10 (e.g. for forming an HBT having a graded base).

EXAMPLE 7

Figure 8:
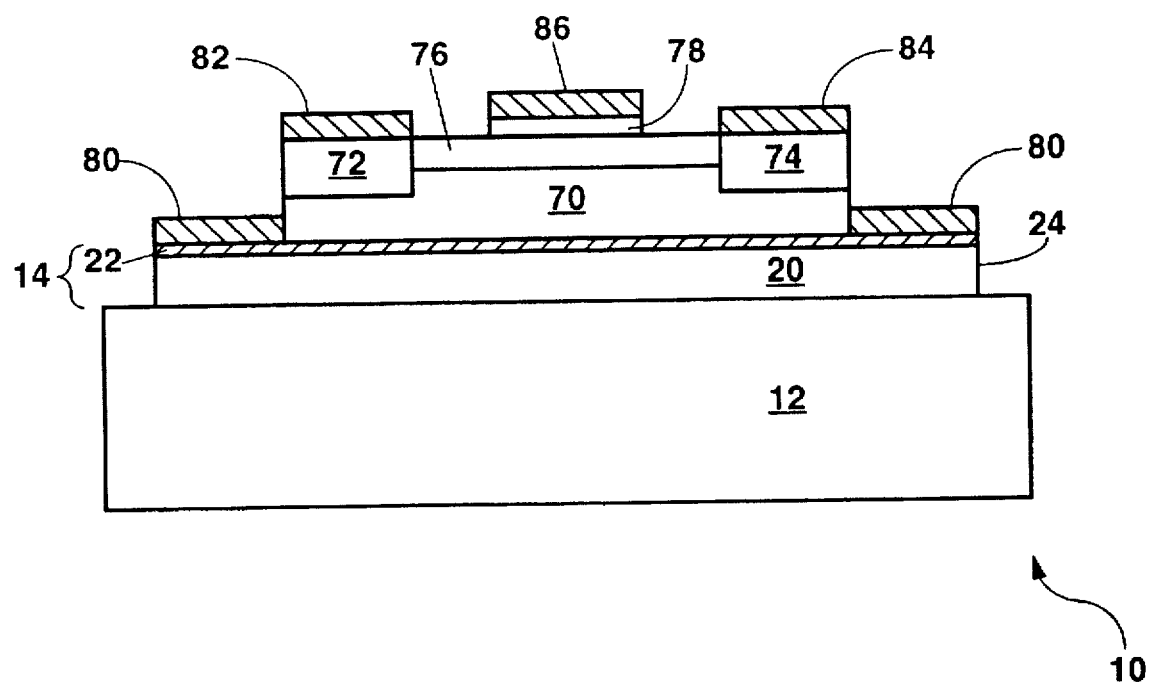
FIG. 8 shows a cross-sectional view of a seventh example of a semiconductor structure according to the present invention in the form of a back-gated field-effect transistor.

FIG. 8 shows a cross-sectional view of a seventh example of the present invention. In FIG. 8, the semiconductor structure 10 comprises a plurality of semiconductor layers grown on a substrate 12 for forming a field-effect transistor (FET). The layers as grown include an AlSb-alloy layer 14 (shown completely converted to form superposed insulating and conducting portions 20 and 22, respectively) and an overlying transistor-forming layer 70 (e.g. n- or p-type InGaAs) that may be about 1 μm thick. The transistor-forming layer 70 may further include one or more oppositely doped sublayers 76 (including quantum-well layers) for forming a lateral current channel within layer 70 and for improving carrier transport within the FET structure 10 (e.g by forming a 2-dimensional electron or hole gas). After growth of the semiconductor layers, drain 72 and source 74 may be formed by selective ion implantation or by dopant diffusion through a patterned masking layer (not shown). In some embodiments of the present invention, a gate layer 78 (e.g. an epitaxially-grown semiconductor layer or a deposited dielectric layer) may be provided with an overlying gate electrode 86 for forming a top gate of the FET; whereas in other embodiments of the invention, gate layer 78 may be omitted with gate electrode 86 forming a Schottky top gate. In FIG. 8, etched access regions form sidewalls 24 for oxidizing the AlSb-alloy layer 14 and forming electrically insulating and conducting portions therefrom as described heretofore. The deposition of back-gate, drain, source and gate electrodes (80, 82, 84 and 86, respectively) may be performed prior to the oxidation process or afterwards. (It may be preferable at least to form back-gate electrode 80 prior to the oxidation process to encapsulate and protect conducting layer 22 and to prevent any surface roughening of layers forming the top gate.)

In the example of FIG. 8, the combination of the insulating portion 20 completely underlying the FET and the access region(s) formed thereabout electrically isolate the device allowing a plurality of individual devices to be fabricated on a common substrate, thereby forming an integrated circuit. Dielectric layers (e.g. polyimide, spin-on glass or the like) may be provided to protect the plurality of devices and to provide for electrical isolation between a multi-level interconnect metallization. Furthermore, the conducting portion 22 in the example of FIG. 8 forms an Ohmic or Schottky contact to overlying layer 70 thereby forming a transistor back gate. In a FET, an effective thickness of the conducting channel is controlled by a voltage applied to the gate electrode which fixes the depth of a depletion region formed adjacent to the gate. The provision of a back gate operating in combination with the gate may provide for improved electrical characteristics of the FET (e.g. increased pinch-off of the conducting channel from two sides thereof and improved sub-threshold electrical characteristics).

EXAMPLE 8

Figure 9:
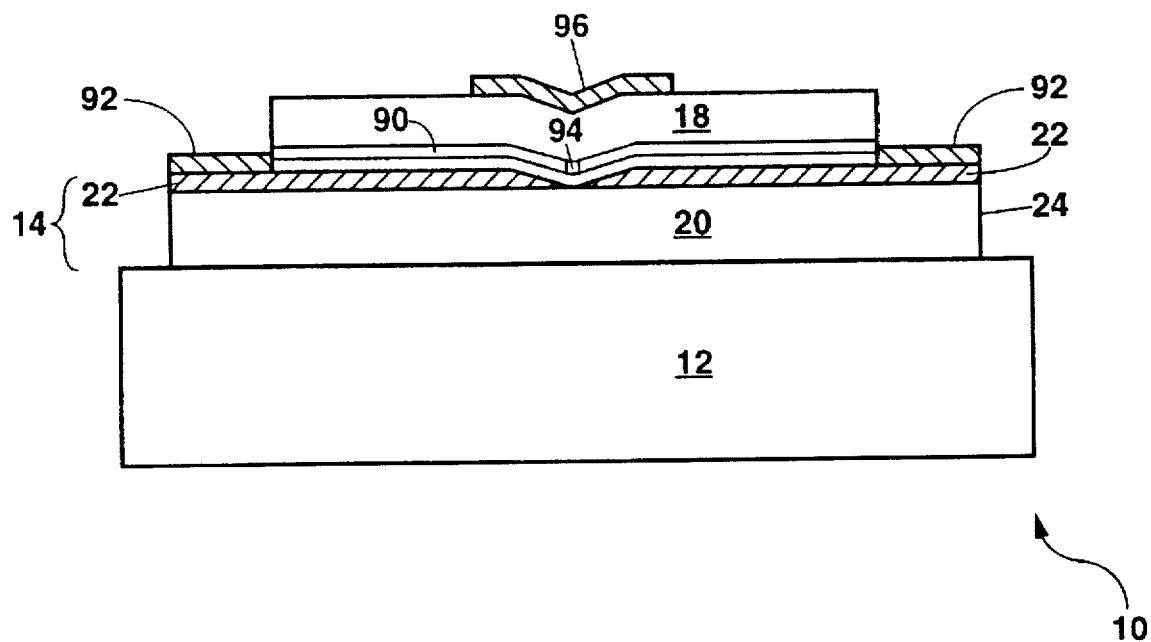
FIG. 9 shows a cross-sectional view of an eighth example of a semiconductor structure according to the present invention in the form of a quantum-effect electronic device.

FIG. 9 shows a cross-sectional view of an eighth example of the present invention. In FIG. 9, the semiconductor structure 10 comprises a plurality of semiconductor layers epitaxially grown on a substrate 12 for forming a quantum-effect electronic device. The semiconductor layers include an AlSb-alloy layer 14 that is converted to form superposed electrically insulating and conducting portions (20 and 22, respectively); and a doped overlayer 18 (e.g. an n-type last-grown semiconductor layer) that preferably includes one or more quantum-well sublayers 90. After epitaxial growth of the layers, the overlayer 18 is patterned and any exposed top surface of the AlSb-alloy layer 14 is preferably covered (e.g. with a dielectric such as silicon nitride, or with a patterned metallization forming back-gate electrodes 92). Access regions may then be etched to form a mesa with exposed sidewalls 24 for oxidizing the AlSb-alloy layer and converting the layer to superposed electrically insulating and conducting portions 20 and 22. Oxidation of the layer 14 is preferably terminated when conducting portions 22 extending laterally inward from sidewalls 24 intersect, or most preferably just before such intersection. Near such an intersection, the Sb layer thickness is tapered due to a depletion of Sb (presumably due to a laterally outward stress-induced migration of the Sb arising from deformation of overlayer 18). An electric field produced by the application of a bias voltage to a back gate formed from the electrically conducting portion 22 locally depletes carriers above the portion 22. A reduction in the electric field above the intersection (or an absence of the electric field in a region wherein there is no Sb present) results in a localized concentration of carriers which forms a quantum wire 94 (i.e. a quantum confinement of carriers in two dimensions forming a 1-dimensional electron or hole gas) within overlayer 18 or sublayer 90. Carriers (i.e. electrons or holes) may be generated within the quantum wire by application of a bias voltage or current, with a 1-dimensional (1-D) flow of the carriers being controlled by a back gate formed by the electrically conducting layer 22 and a front gate formed by gate electrode 96 deposited above the quantum wire 94.

By shaping the mesa or by providing a patterned masking layer (e.g. silicon nitride) above the AlSb-alloy layer to produce a spatially-varying stress field therein, a plurality of interconnected quantum-effect electronic devices may be formed. For example, 1-D quantum wire devices may be formed for spatial regions wherein the mesa has a small lateral width or wherein a masking layer is absent so that after oxidation of the AlSb-alloy layer 14 the conducting portions 22 intersect; while a 2-dimensional (2-D) quantum-well device (providing for a 2-D flow of carriers) may be formed for spatial regions wherein the mesa has a larger lateral width or wherein a masking layer is present to retard the lateral extent of oxidation of layer 14 so that no intersection of the conducting portions 22 occurs. Thus, according to the present invention a quantum-effect structure 10 may be formed with a plurality of interconnected 1-D and 2-D devices, with the 1-D devices (comprising quantum wires) forming branched interconnections and loops. Such a quantum-effect structure may be used to form many different types of quantum-effect electronic devices as known to the art, including Coulomb blockade devices, double-barrier devices, Aharanov-Bohm effect devices, resonant tunneling devices and gated 1-D charge-coupled devices.

The matter set forth in the foregoing description and accompanying drawings is offered by way of illustration only and not as a limitation. Other applications and variations of the semiconductor structures according to the present invention will become evident to those skilled in the art. The actual scope of the invention is intended to be defined in the following claims when viewed in their proper perspective based on the prior art.

What is claimed is:

1. A semiconductor structure comprising a plurality of semiconductor layers formed on a substrate including at least one layer of a III–V compound-semiconductor alloy comprising aluminum (Al) and antimony (Sb) buried below a patterned overlayer, with at least a part of the AlSb-alloy layer being converted to form an electrically conducting portion comprising Sb overlying an electrically insulating portion comprising an oxide of aluminum.

2. The semiconductor structure of claim 1 further including at least one etched access region formed in the semiconductor layers and extending downward at least to the AlSb-alloy layer, each etched access region having a sidewall wherefrom the electrically insulating and electrically conducting portions extend inward into the AlSb-alloy layer.

3. The semiconductor structure of claim 1 wherein the AlSb-alloy layer comprises an AlSb alloy selected from the group consisting of AlSb, AlAsSb, AlPSb, AlGaSb, AlGaAsSb, AlInAsSb, and AlGaPSb; and the substrate is selected from the group consisting of InP, GaAs, GaSb and InAs.

4. The semiconductor structure of claim 1 wherein the AlSb-alloy layer comprises $AlAs_xSb_{1-x}$ with $0 \leq x \leq 1$; and the substrate is selected from the group consisting of InP, InAs and GaSb.

5. The semiconductor structure of claim 1 wherein the AlSb-alloy layer comprises $AlAs_xSb_{1-x}$ with x being about 0.56; and the substrate is InP.

6. The semiconductor structure of claim 1 wherein the AlSb-alloy layer comprises AlPSb; and the substrate is GaAs.

7. The semiconductor structure of claim 1 wherein the AlSb-alloy layer comprises an alloy including gallium (Ga); and the substrate is GaSb or InAs.

8. The semiconductor structure of claim 1 wherein the AlSb alloy is substantially lattice matched to the substrate.

9. The semiconductor structure of claim 1 wherein the plurality of semiconductor layers further includes an active region sandwiched between the substrate and the AlSb-alloy layer, and a semiconductor junction about the active region to form an optoelectronic device.

10. The semiconductor structure of claim 9 wherein the AlSb-alloy layer forms a control layer for channeling a flow of an electrical current through an as-grown portion of the AlSb-alloy layer.

11. The semiconductor structure of claim 1 in the form of a heterojunction bipolar transistor wherein an unoxidized portion of the AlSb-alloy layer forms an emitter layer of the transistor, with a base layer being formed above the emitter from one of the plurality of semiconductor layers, and with a collector layer being formed above the base layer from another of the plurality of semiconductor layers, the emitter and collector layers being doped with a first dopant type and the base layer being doped with a second dopant type opposite the first dopant type.

12. A semiconductor structure comprising:
 (a) a substrate;
 (b) a plurality of semiconductor layers epitaxially grown on the substrate including at least one buried layer of an AlSb semiconductor alloy; and
 (c) a mesa formed within the semiconductor layers and extending downward at least to the buried AlSb-alloy layer, the mesa having at least one sidewall wherefrom superposed electrically insulating and electrically conducting portions formed from the AlSb-alloy layer extend laterally inward.

13. The semiconductor structure of claim 12 wherein the electrically insulating portion comprises an oxide of aluminum, and the electrically conducting portion comprises antimony (Sb).

14. The semiconductor structure of claim 12 wherein the superposed electrically insulating and electrically conducting portions of the AlSb-alloy layer form a control layer for channeling a flow of an electrical current through an as-grown portion of the AlSb-alloy layer.

15. The semiconductor structure of claim 12 wherein a first group of the semiconductor layers is doped n-type and a second group of the semiconductor layers is doped p-type forming a semiconductor junction.

16. The semiconductor structure of claim 15 wherein the semiconductor layers include an active region centered about the semiconductor junction and proximate to the AlSb-alloy layer.

17. The semiconductor structure of claim 16 wherein the active region includes at least one quantum-well layer sandwiched between a pair of cladding layers.

18. The semiconductor structure of claim 16 further including a pair of distributed Bragg reflector (DBR) mirrors comprising a plurality of pairs of alternating one-quarter-wavelength thick layers of high and low energy bandgaps or refractive indices with at least one DBR mirror being formed from the plurality of semiconductor layers, the pair of DBR mirrors forming a resonant optical cavity about the active region.

19. The semiconductor structure of claim 18 wherein a first DBR mirror below the active region is formed from the plurality of semiconductor layers, and a second DBR mirror above the active region comprises a plurality of deposited dielectric layers.

20. The semiconductor structure of claim 18 wherein each DBR mirror is formed from the plurality of semiconductor layers.

21. The semiconductor structure of claim 18 wherein the DBR mirrors and active region have layer thicknesses and compositions matched to a wavelength of light in the range of about 1.3 to about 1.6 μm.

22. The semiconductor structure of claim 19 wherein the substrate is InP; and the AlSb-alloy layer is $AlAs_xSb_{1-x}$ with $0 \leq x \leq 1$.

23. The semiconductor structure of claim 20 wherein x is about 0.56.

24. The semiconductor structure of claim 18 further including electrodes above the electrically conducting portion formed from the AlSb-alloy layer and below the substrate to provide a flow of an electrical current through an unoxidized portion of the AlSb-alloy layer and into the active layer to generate light therein.

25. A semiconductor structure comprising:
  (a) a substrate;
  (b) at least one layer of a III–V compound-semiconductor alloy including aluminum (Al) and antimony (Sb) epitaxially grown on the substrate, with the AlSb-alloy layer having a layer thickness greater than about 5 nanometers and being chemically converted, at least in part, to form superposed electrically insulating and electrically conducting portions; and
  (c) an overlayer covering at least a part of the superposed electrically insulating and conducting portions formed from the AlSb-alloy layer.

26. The semiconductor structure of claim 25 wherein the overlayer comprises a substantially monocrystalline semiconductor layer epitaxially grown above the AlSb-alloy layer.

27. The semiconductor structure of claim 25 wherein the overlayer comprises a material selected from the group consisting of dielectric materials and metals deposited above the AlSb-alloy layer.

28. The semiconductor structure of claim 25 wherein the electrically insulating portion comprises an oxide of aluminum; and the electrically conducting portion comprises Sb.

29. The semiconductor structure of claim 25 wherein the AlSb-alloy layer comprises an AlSb alloy selected from the group consisting of AlSb, AlAsSb, AlPSb, AlGaSb, AlGaAsSb, AlInAsSb, and AlGaPSb; and the substrate is selected from the group consisting of InP, GaAs, GaSb and InAs.

30. The semiconductor structure of claim 25 wherein the AlSb alloy is $AlAs_xSb_{1-x}$ with $0 \leq x \leq 1$; and the substrate is selected from the group consisting of InP, InAs, and GaSb.

31. The semiconductor structure of claim 25 wherein the AlSb alloy is $AlAs_xSb_{1-x}$ with x being about 0.56; and the substrate is InP.

32. The semiconductor structure of claim 25 further including an active region epitaxially grown on the substrate proximate to the AlSb-alloy layer.

33. The semiconductor structure of claim 32 further including a semiconductor junction formed about the active region.

34. The semiconductor structure of claim 33 wherein the AlSb-layer forms a control layer for channeling a flow of an electrical current into the active region.

35. The semiconductor structure of claim 33 further including electrodes above and below the active region to form an optoelectronic device.

36. The semiconductor structure of claim 33 further including a pair of distributed Bragg reflector (DBR) mirrors comprising a plurality of pairs of alternating one-quarter-wavelength thick layers of high and low energy bandgaps or refractive indices and forming a resonant optical cavity about the active region.

37. The semiconductor structure of claim 36 wherein a first DBR mirror below the active region is formed from a plurality of epitaxially-grown semiconductor layers, and a second DBR mirror above the active region comprises a plurality of deposited dielectric layers.

38. The semiconductor structure of claim 36 wherein the DBR mirrors comprise alternating high-bandgap semiconductor layers and low-bandgap semiconductor layers, with the layers each being about one-quarter wavelength thick.

39. The semiconductor structure of claim 36 further including electrodes above the electrically conducting portion formed from the AlSb-alloy layer and below the substrate to electrically activate the semiconductor structure to generate, to detect or to modulate light.

40. The semiconductor structure of claim 39 wherein the DBR mirrors and active region have layer thicknesses and compositions matched to a wavelength of light in the range of about 1.3 to about 1.6 μm.

41. The semiconductor structure of claim 25 in the form of a heterojunction bipolar transistor wherein an unoxidized portion of the AlSb-alloy layer forms an emitter layer of the transistor, with a base layer being formed above the emitter from one of the plurality of semiconductor layers, and with a collector layer being formed above the base layer from another of the plurality of semiconductor layers, the emitter and collector layers being doped with a first dopant type and the base layer being doped with a second dopant type opposite the first dopant type.

42. A semiconductor structure comprising:
  (a) an AlSb-alloy layer epitaxially grown above a substrate, the AlSb-alloy layer being at least 5 nanometers thick and having at least a portion thereof chemically converted to form superposed electrically-insulating and electrically-conducting layers; and
  (b) an overlayer above the converted portion of the AlSb-alloy layer during formation of the converted portion.

43. The semiconductor structure of claim 42 wherein the overlayer comprises a material selected from the group consisting of a semiconductor, a dielectric and a metal.

44. The semiconductor structure of claim 42 wherein the AlSb-alloy layer comprises an AlSb alloy selected from the group consisting of AlSb, AlAsSb, AlPSb, AlGaSb, AlGaAsSb, AlInAsSb, and AlGaPSb.

45. The semiconductor structure of claim 45 wherein the substrate comprises a semiconductor alloy selected from the group consisting of InP, GaAs, GaSb and InAs.

46. The semiconductor structure of claim 42 wherein the AlSb-alloy layer comprises $AlAs_xSb_{1-x}$ with $0 \leq x \leq 1$.

47. The semiconductor structure of claim 1 wherein the overlayer is selected from the group consisting of semiconductor layers, dielectric layers and metal layers.

48. The semiconductor structure of claim 1 wherein the overlayer comprises a removable masking layer.

49. The semiconductor structure of claim 1 in the form of a field-effect transistor wherein one of the plurality of semiconductor layers above the AlSb-alloy layer comprises a transistor-forming layer having a lateral current channel with a source formed on one side of the current channel and a drain formed on the other side of the current channel, and further including a gate formed above the current channel.

50. The semiconductor structure of claim 1 in the form of a quantum-effect device wherein a layer thickness of the electrically conducting portion is tapered laterally inward from a pair of opposing sidewalls to define a quantum wire in one of the plurality of semiconductor layers above the electrically conducting portion, and a gate is provided proximate to the quantum wire to control a flow of carriers therein.

51. The semiconductor structure of claim 25 in the form of a field-effect transistor wherein one of the plurality of semiconductor layers above the AlSb-alloy layer comprises a transistor-forming layer having a lateral current channel with a source formed on one side of the current channel and a drain formed on the other side of the current channel, and further including a gate formed above the current channel.

52. The semiconductor structure of claim 25 in the form of a quantum-effect device wherein a layer thickness of the electrically conducting portion is tapered laterally inward from a pair of opposing sidewalls to define a quantum wire in one of the plurality of semiconductor layers above the electrically conducting portion, and a gate is provided proximate to the quantum wire to control a flow of carriers therein.

* * * * *